United States Patent
Ballesteros et al.

[11] Patent Number: 5,806,687
[45] Date of Patent: Sep. 15, 1998

[54] SWINGING GATE RACK

[76] Inventors: Enrie R. Ballesteros, 9309 Ruffner Ave., Sepulveda, Calif. 91343; Keith Boutillier, 5946 Suva St., Cypress, Calif. 90630; Tadashi Nakauchi, 10701 Baton Rouge Ave., Northridge, Calif. 91326

[21] Appl. No.: 807,656

[22] Filed: Feb. 27, 1997

[51] Int. Cl.[6] .......................................... A47F 7/00
[52] U.S. Cl. ................................................ 211/26; 211/169
[58] Field of Search ...................... 211/26, 86.01, 211/162, 169

[56] References Cited

U.S. PATENT DOCUMENTS

| | | | |
|---|---|---|---|
| 5,307,942 | 5/1994 | Quelfeter et al. | 211/26 |
| 5,540,339 | 7/1996 | Lerman | 211/26 |
| 5,593,046 | 1/1997 | Katsuura et al. | 211/26 X |

OTHER PUBLICATIONS

Chatsworth Products, Inc., "Datacom Framework Systems", pp. 26–29, Jan. 1992.
Homaco, Inc. catalog, "Swing–EZ Racks", p. 39.

Primary Examiner—Alvin C. Chin-Shue
Assistant Examiner—Sarah Purol
Attorney, Agent, or Firm—Kennedy, Covington, Lobdell & Hickman LLP

[57] ABSTRACT

A wall-mounted swinging gate rack for electronic components including a rack frame for supporting electronic components thereon, the rack frame including two vertical uprights, a lower horizontal rail, and an upper horizontal rail, each of the rails having two ends and an extending length, each of the rails also having a first pivot point and a second pivot, the first pivot points being substantially vertically aligned and the second pivot points being substantially vertically aligned to thereby define first and second substantially vertical axes for pivotal movement of the rack frame. The rack frame is supported on first and second pivot plate members of either the first or second pivot points for pivotal movement about the first or second vertical axis, respectively.

18 Claims, 8 Drawing Sheets

SWINGING GATE RACK

BACKGROUND OF THE INVENTION

The present invention relates to a swinging gate rack for supporting electronic components thereon and, more particularly, to a swinging gate rack which can be mounted for pivotal rotation about either of two axes to allow the rack to pivot open in a clockwise or counterclockwise direction, and which can pivot about offset pivot points to provide access to the back side of the electronic components mounted therein while reducing the amount of space taken up by the rack when swung open.

It is well known to provide a rack for mounting and supporting various types of electronic components for the purposes of protecting the components, providing easy access to the components should repair or modification be required, organizing wiring and cabling associated with the components, and improving the appearance of the electronic equipment. Racks of this type are frequently used with telecommunications and computer equipment and are particularly well-suited for components associated with networks of such equipment.

As the importance of telecommunications and computer networks have increased in the business world, the space required for installation of such equipment has, in many cases, increased. Given the significant expense associated with additional office space to be dedicated to telecommunications and computer equipment, it is highly desirable to minimize the space taken up by such equipment. As such racks are increasingly installed in tight spaces, it has become more advantageous for a rack to have the capability of being easily mounted so that it pivots open in either a clockwise or counterclockwise direction, and for the opening direction to be easily changed. Space efficiency is also desirable, and while previous rack designs have attempted to maximize space efficiency, all known attempts suffer from various disadvantages.

The Wall-Mounted Equipment Rack (100 Series) sold by the assignee of the present application provides for mounting of electronic components on a wall above floor level, but this rack provides no convenient way to access the backside of the mounted components for repair and modification. The Swing Gate Rack (113 Series) sold by the present assignee is wall mountable and swings open to allow access to both sides of mounted equipment. However, the gate rack pivots about an end and the clearance required for swinging open the rack consumes a substantial amount of space, reducing the ability to mount another swing gate rack on an opposing wall in a small space, such as the closets or restricted spaces in which equipment of this type is frequently installed. Moreover, while this Swing Gate Rack is stackable, the racks have no provision for interconnecting with each other in a stacked arrangement, and the opening direction of these racks cannot be changed without demounting the entire rack assembly.

Another Swing Gate Rack (30000 Series) previously sold by the present assignee also can be swung open for easy access to both sides of the mounted equipment. However, this rack also requires substantial clearance in order to be swung open, it has no provision for stacking of additional racks vertically together, and changing the opening direction of the rack requires disassembly and switching of hinge mounts and a support wheel on the rack.

The Swing-EZ Rack sold by Homaco, Inc. can be wall-mounted and can be swung open for access to the back side of equipment mounted therein, but the rack pivots from the end and therefore requires a large clearance space when swung open. The Swing EZ-Rack is also not readily interconnectable with other racks, and the opening direction of the rack can only be changed by removing the entire rack assembly and turning it over.

Accordingly, a need exists for a swinging gate rack which provides access to both sides of mounted equipment and can be mounted for either clockwise or counterclockwise opening pivotal movement, yet is highly space efficient in both open and closed positions.

SUMMARY OF THE INVENTION

The present invention provides a swinging gate rack for supporting electronic components thereon which optimizes space efficiency while providing easy access to all sides of the equipment.

Briefly summarized, the present invention provides a wall-mounted swinging gate rack for electronic components which includes a rack frame for supporting the electronic components thereon having two vertical uprights, an upper horizontal rail, and a lower horizontal rail, each of the rails having two ends, an extending length, a first pivot point and a second pivot point, the pivot points being located intermediate the rail ends and spaced from each other, the first pivot points on the rails being substantially vertically aligned and the second pivot points being substantially vertically aligned to thereby define, respectively, first and second substantially vertical axes for pivotal movement of the rack frame. A first bracket assembly is adapted to be fixedly attached to the wall, and includes a horizontal support for extending outwardly from the wall and a first pivot plate member mounted at the extending end of the horizontal support. A second bracket assembly is adapted to be fixedly attached to the wall and generally vertically aligned with and spaced a predetermined distance above the first bracket assembly, the second bracket assembly including a horizontal support for extending outwardly from the wall and a second pivot plate member mounted at the extending end of the horizontal support, and an arrangement for supporting the frame on the first and second pivot plate members at either the first or second pivot points for pivotal movement about the first or second vertical axis, respectively.

Preferably, the first pivot point on each of the rails is located offset from one of the rail ends a distance between 10% and 40% of the extending length of the rail, and the second pivot point is located offset from the other of the rail ends a distance between 10% and 40% of the extending length. The first and second pivot points may each advantageously be located offset from the respective rail ends a distance approximately 30% of the extending length.

The first and second pivot points may be, respectively, first and second bores, with the first pivot plate member having a pair of bores aligned with and adjacent the bores on the lower rail, and the second pivot plate member having a pair of bores aligned with and adjacent the bores on the upper rail. The arrangement for supporting the frame may comprise a pair of bolts disposed in either the first bores and the pivot plate member bores aligned and adjacent thereto, or the second bores and the pivot plate member bores aligned and adjacent thereto. The bores on the first and second pivot plate members may be threaded, and each of the pivot bolts may have a threaded portion for threaded engagement in one of the pivot plate member bores.

Preferably, the rack frame may be pivotally movable to a closed position, wherein the rails are positioned generally parallel to the wall, and the rack frame may include a pair of locking bolts for disposition in the other of the first or second bores and the corresponding pivot plate member bores so as to lock the frame in the closed position. Each of the locking bolts may have a threaded portion for engagement in one of the pivot plate member bores.

The present invention may preferably include a second rack frame having rails with first and second pivot points thereon, the pivot points being located intermediate the ends of the rails and spaced from each other, the first pivot points being substantially vertically aligned and the second pivot points being substantially vertically aligned to thereby define, respectively, first and second substantially vertical axes of the second frame for pivotal movement of the second frame. A third bracket assembly may be provided to be fixedly attached to the wall and generally vertically aligned with and spaced a predetermined distance above the second bracket assembly, and it may include a horizontal support for extending outwardly from the wall and a third pivot plate member mounted at an extending end of the horizontal support. An arrangement may be provided for supporting the second rack frame on the second and third pivot plate members at either the first or second pivot points of the second frame for pivotal movement about the first or second vertical axis of the second frame, respectively.

In accordance with another aspect of the present invention, the swinging gate rack may include a first rack frame including two vertical uprights, an upper horizontal rail, and lower horizontal rail, each of the rails having two ends and an extending length, a second rack frame also having two vertical uprights, an upper horizontal rail, and a lower horizontal rail, each having two ends and an extending length, each of the rails having an offset pivot point located spaced from one of the ends of the rail a distance between 10% and 40% of the extending length, the pivot points on each rail being substantially vertically aligned to define a substantially vertical axis for offset pivot movement of the rack frame. A first bracket assembly may be fixedly affixed to the wall and include a horizontal support and a first pivot plate member mounted at an extending end of the horizontal support, and a second bracket assembly may also be fixedly attached to the wall and generally vertically aligned with and spaced above the first bracket assembly, the second bracket assembly including a horizontal support and a second pivot plate member mounted at an extending end of the horizontal support. A third bracket assembly may also be fixedly attached to the wall and generally vertically aligned with and spaced above the second bracket assembly, and may include a horizontal support and a third pivot plate member mounted at an extending end of the horizontal support. An arrangement may be provided for supporting the first rack frame on the first and second pivot plate members at the pivot points of the first frame for offset pivotal movement about the vertical axis, and an arrangement may also be provided for supporting the second frame on the second and third pivot plate members at the pivot points of the second frame for offset pivotal movement about the vertical axis.

Accordingly, the present invention provides a swinging gate rack which can be mounted for pivotal rotation about either of two pivotal axes to allow the rack to pivot open in a clockwise or counterclockwise direction, and which can pivot about an offset pivot point to thereby reduce the clearance space required for opening and closing movement and increase the load-bearing capacity of the rack. Moreover, both the front and back of the rack frame of the present invention can be easily accessed for service and other work. In the preferred embodiment, the gate rack of the present invention is easily expanded to include a second rack frame.

DESCRIPTION OF THE PREFERRED EMBODIMENT

Figure 1:
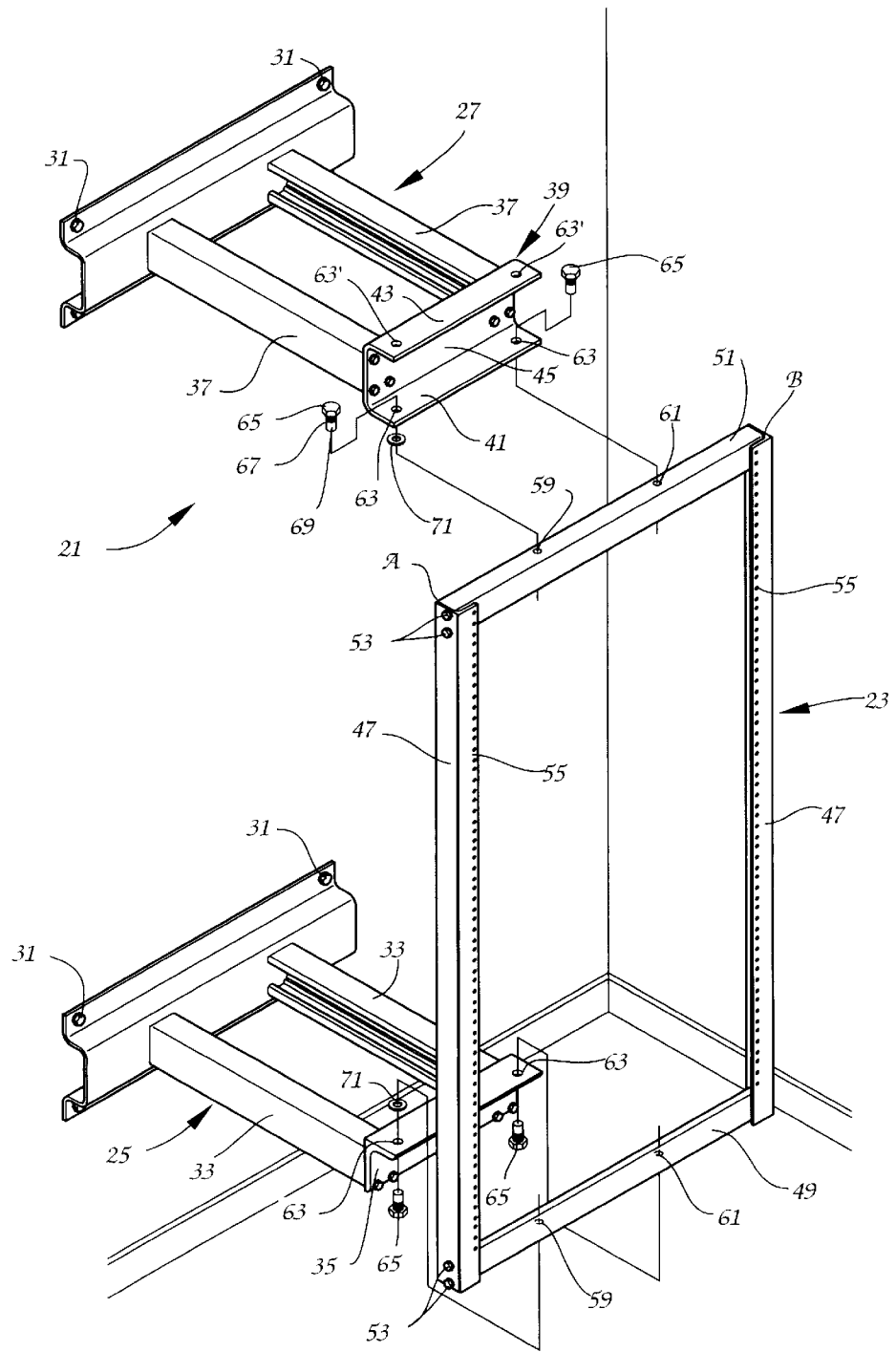
FIG. 1 is a partially exploded isometric view of a swinging gate rack frame of the present invention having a single rack frame.

Referring now to the accompany drawings, a swinging gate rack 21 of the present invention is depicted in FIG. 1 in an exploded view showing the mounting of rack frame 23 on first bracket assembly 25 and second bracket assembly 27. First bracket assembly 25 is fixedly attached to a wall by conventional screws 31, and includes two members 33 extending horizontally outwardly from the wall and a first pivot plate member in the form of an angle member 35 mounted at the extending ends of horizontal members 33.

The second bracket assembly 27 is fixed to the wall by conventional screws 31 in general vertical alignment with first bracket assembly 25 and is spaced a predetermined distance above the first bracket assembly. The second bracket assembly 39 includes two members 37 extending horizontally outwardly from the wall and a second pivot plate member in the form of a channel 39 mounted at the extending ends of horizontal members 37, and including two horizontal flanges 41,43 and an interconnecting web portion 45.

Rack frame 23 is composed of two vertical uprights 47, a lower horizontal rail 49, and an upper horizontal rail 51, which are joined together by appropriate conventional fastening devices such as screws 53, although welding or a unitary rack frame could be employed. Mounting holes 55 are formed in vertical uprights 47 for installation of electronic components 57 on rack frame 23, as will be explained in greater detail presently in connection with FIG. 7, and may be arranged in a universal alternating hole pattern, such as ⅝"-⅝"-½", to allow quick mounting therein of a wide variety of equipment configured for such patterns.

Lower horizontal rail 49 and upper horizontal rail 51 each have two ends A,B, with first bores 59 and second bores 61 being located intermediate the rail ends A,B and spaced from each other. The first bores 59 on the lower rail 49 and the upper rail 51 are substantially vertically aligned, and the second bores 61 on rails 49,51 are also substantially vertically aligned, to thereby define, respectively, first and second substantially vertical axes for offset pivotal movement of the rack frame 25, as will be described in greater detail presently.

Figure 2:
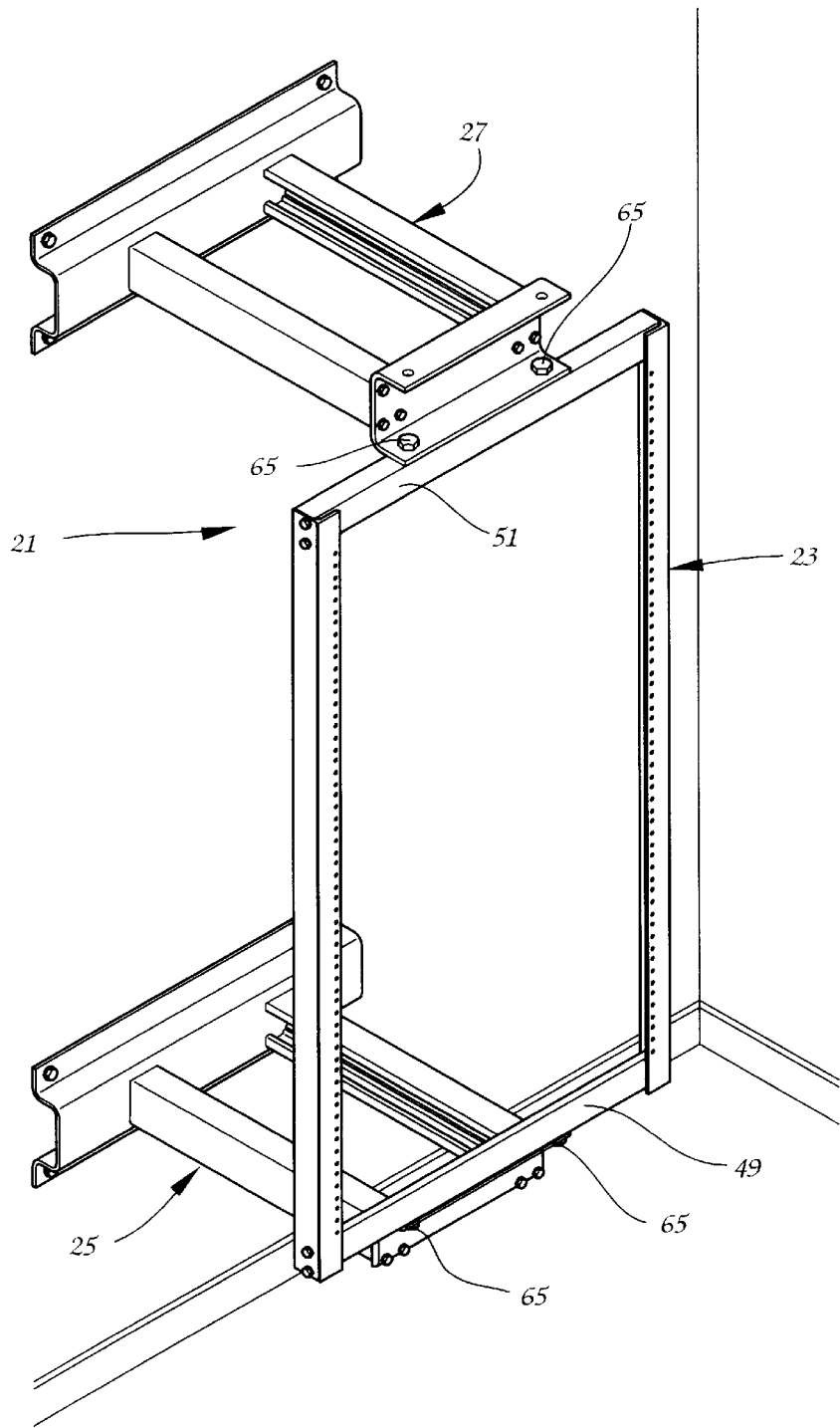
FIG. 2 is an assembled isometric view of the gate rack of FIG. 2.

Angle member 35 and channel member 39 each have two threaded bores 63 formed therein, and the bores 63 are spaced so as to be aligned and adjacent bores 59,61 on rails 49,51 when the rack frame 23 is mounted in its closed position (see FIG. 2).

The rack frame 23 is mounted on angle member 35 and channel member 39 by bolts 65, each of which has a threaded portion 67 for threaded engagement in bores 63, and a non-threaded portion 69 for extending into bores 59,61, as illustrated in FIG. 1. The rack frame 23 can thus pivot about the non-threaded portions 69 of bolts 65 for offset pivotal opening and closing movement, while the bolts 65 remain threadedly engaged in bores 63 of the angle member 35 and the channel member 39. Washers 61 are located on the bolts 65 which engage the set of bores 59,61 about which the rack frame 25 will pivot for opening and closing movement, to assist such movement by reducing frictional resistance thereto.

In FIG. 1, the washers 71 are disposed on the bolts 65 which engage the first bores 59, which have been selected as the axis for opening and closing pivotal movement of the rack frame 23. The washers 71 could easily be installed on the bolts 65 which engage the second bores 61, to thereby establish the axis for opening and closing pivotal movement of the rack frame 23 about the second bores 61. Once a pivotal axis has been established in either the first bores 59 or the second bores 61, additional bolts 65 can be inserted in the other set of such bores in order to lock the frame 23 in its closed position generally parallel to the wall.

In FIG. 2, the swinging gate rack 21 of the present invention is shown assembled with the frame 23 locked in the closed position as described. The use of two additional bolts 65, one for each of the non-pivotal bores, provides a secure and positive closure, as well as a stable platform for electronic components mounted thereon, but it should be noted that one additional bolt 65 inserted into one of the non-pivotal bores would be sufficient to adequately hold the frame 23 in place by preventing pivotal movement thereof.

Figure 3:
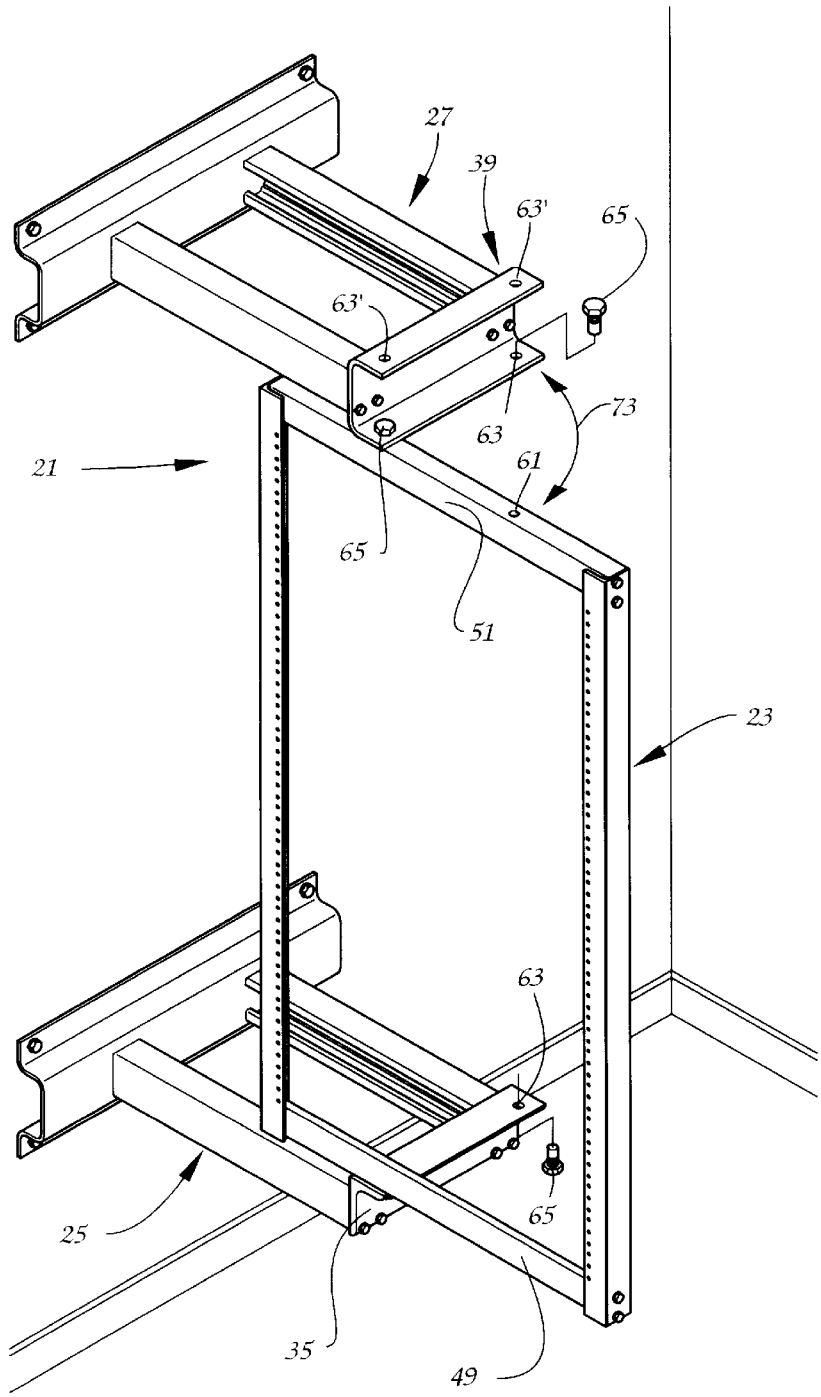
FIG. 3 is an isometric view of the swinging gate rack of FIG. 2, showing the rack frame pivoted open to the left.

It will thus be understood that a pivotal axis for opening and closing movement of the rack frame 23 can easily be established in either the first bores 59 or the second bores 61, as the user desires, by engaging bolts 65 in the set of bores 59 or 61 in which the pivotal axis is to be located and, if necessary, removing the bolts 65 in the other set of bores. Locking of the rack frame 23 securely in its closed position can then be subsequently accomplished by engaging one or more bolts 65 in the other set of bores 59 or 61 in which the pivotal axis is not located. In FIG. 3, the bolts 65 are shown removed from the second bores 61 and the corresponding bores 63 so as to allow clockwise opening pivotal movement of the rack frame 23 to its open position, as indicated by arrow 73.

Figure 4:
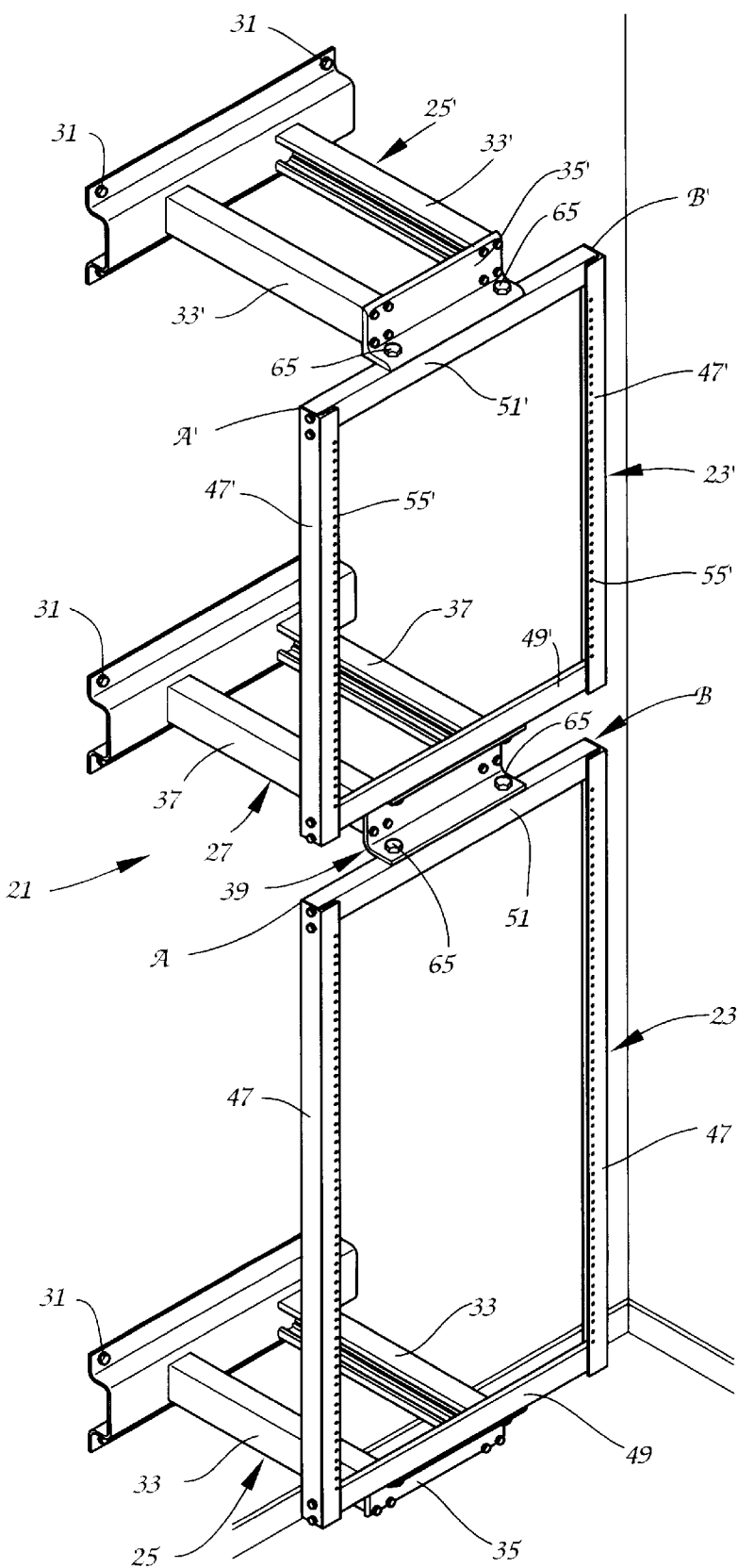
FIG. 4 is an isometric view of a swinging gate rack embodying the present invention having two rack frames.

In another embodiment of the present invention, a second rack frame 23' is mounted above the rack 23 to thereby greatly increase the capacity of gate rack 21 for mounting of electronic components thereon. The second rack frame 23' is constructed and arranged in the same manner as the first rack frame 23, and is supported on channel member 39 and a second angle member 35' in the same manner as the first rack frame 23 is supported on the first angle member 35 and channel member 39. The second angle member 35' forms part of a third bracket assembly 25' which is constructed, arranged, and fixedly attached to the wall in the same manner as the first bracket assembly 25. In FIG. 4, rack frames 23,23' are both shown locked in the closed position.

Figure 5:
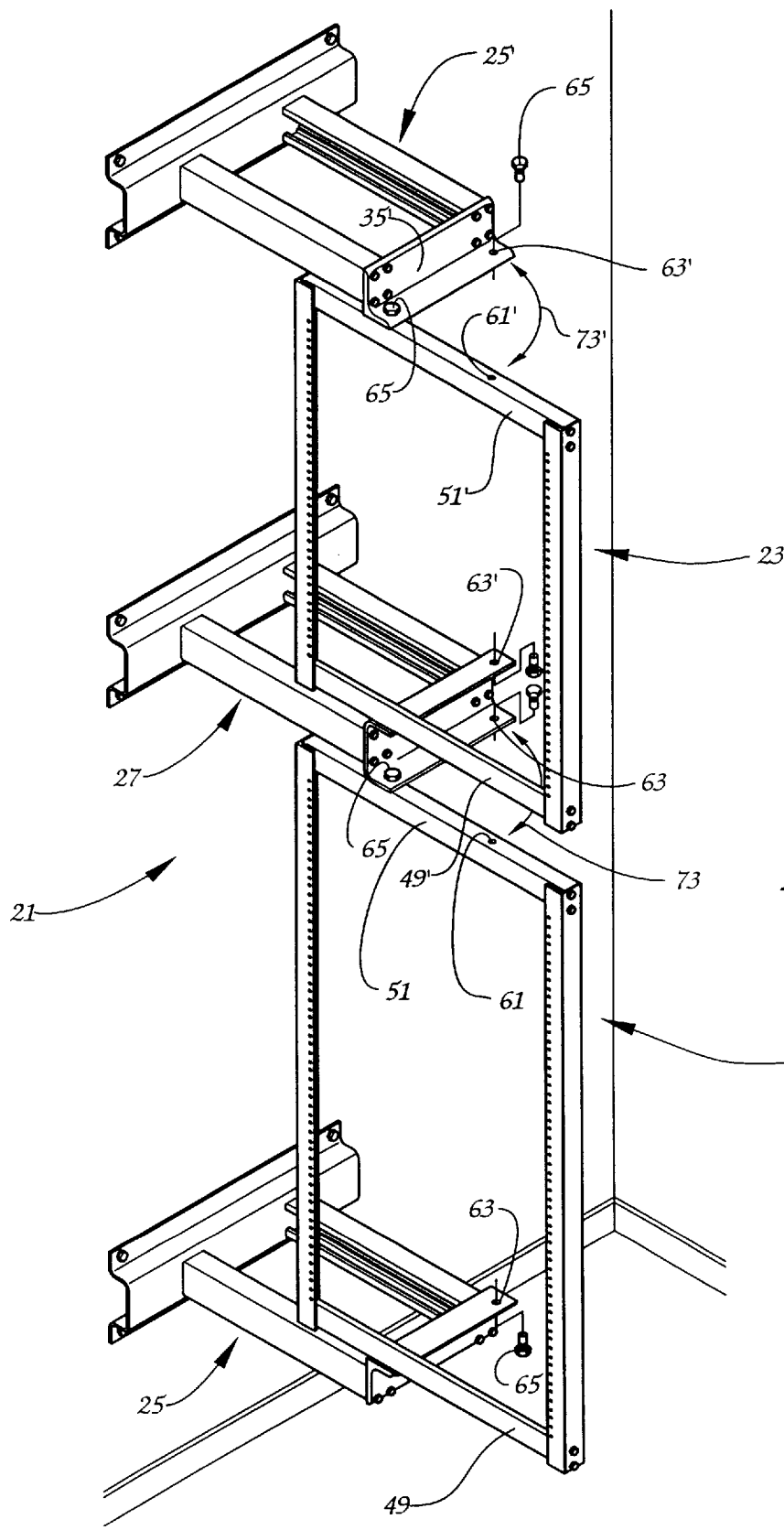
FIG. 5 is an isometric view of the swinging gate rack of FIG. 5 showing both rack frames pivoted open to the left.

FIG. 5 shows the two-tier gate rack 21 of the present invention with the first rack frame 23 and the second rack frame 23' both pivoted into the open position by clockwise movement. Bolts 65 have been removed from the second bores 61,61' and the corresponding bores 63,63' in order to permit offset pivotal opening movement of rack frames 23,23' about bolts 65 engaged in the first bores 59,59'.

Figure 6:
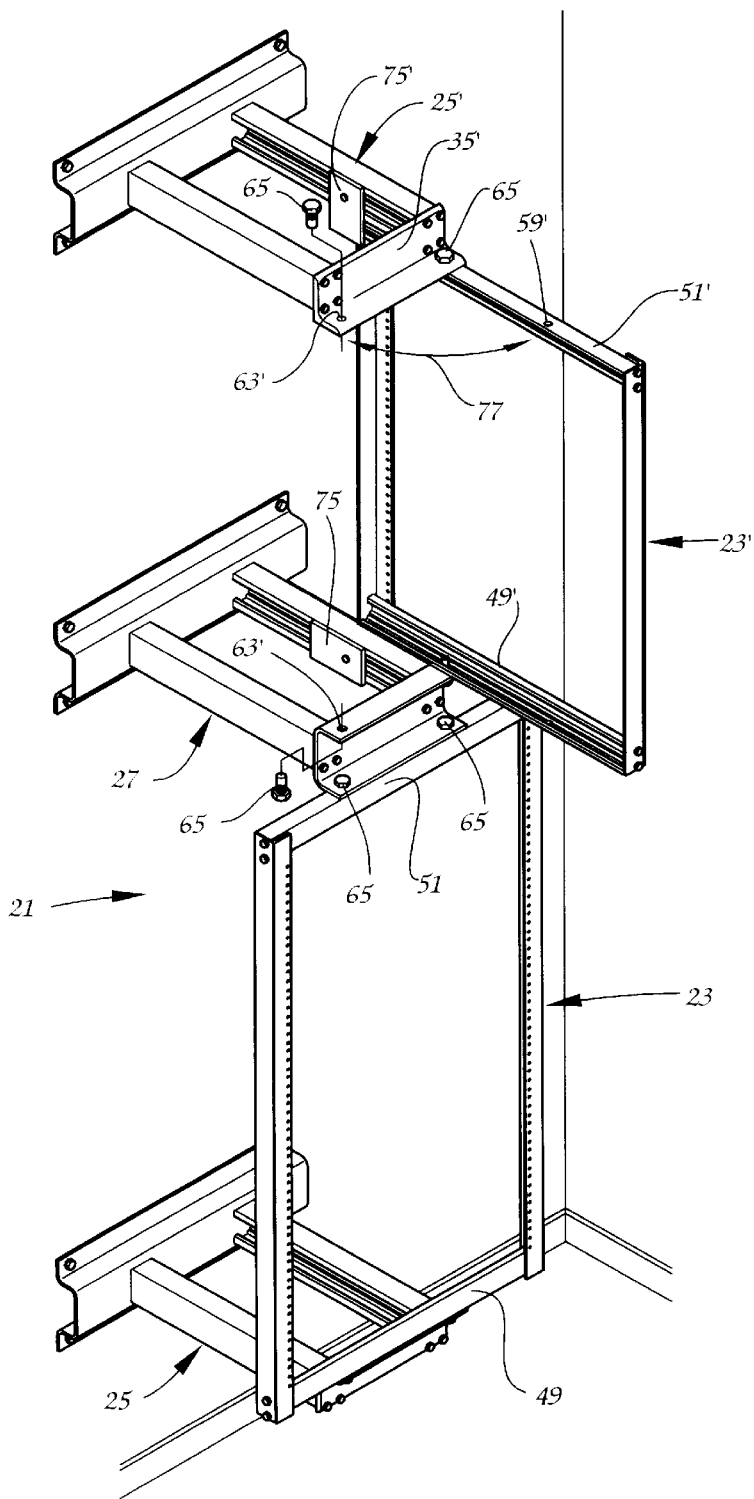
FIG. 6 is an isometric view of the swinging gate rack of FIG. 5, showing the upper rack frame pivoted open to the right and the lower rack frame in the closed position.

FIG. 6 depicts swinging gate rack 21 with the pivotal axis of rack frames 23,23' changed so that the rack frames are opened with counterclockwise pivotal movement, with the rack frame 23' shown pivoted open. This arrangement is made possible, as set out above, because the first bores 59,59' and the second bores 61,61' are essentially identical and the bolts 65 can serve either as pivot pins to establish the pivotal axis or as locking pins to secure rack frames 23,23' in the closed position. The pivotal axes of rack frames 23,23' and their direction of pivotal movement are thus determined by the configuration of bolts 65 in either first bores 59,59' or second bores 61,61'.

Stop devices in the form of stop plates 75,75' are shown installed on the swinging gate rack 21 in FIG. 6. Stop plate 75', which is pivotally mounted on the third horizontal members 33', is shown in its downward position in which it limits the offset opening pivotal movement of the rack frame 29' to approximately 90° of pivotal displacement from the closed position shown in FIG. 4. Stop plate 75, pivotally mounted on the second horizontal members 37, is shown in its upward disengaged position so that it does not operate as a stop to limit offset opening pivotal movement of the rack frame 23.

In the event a single-tiered gate rack, such as is shown in FIGS. 1–3, is originally installed, expansion of the gate rack to add an additional rack frame is easily accomplished. Channel member 39 is predrilled with two sets of bores 63,63' for mounting of a second rack frame 23'. Installation of a third bracket assembly 25', by the aforementioned conventional method of attachment to wall by fasteners such as screws 31, is undertaken with mounting bracket 25' being substantially vertically aligned and spaced a predetermined distance from bracket assembly 27. The second rack frame 23' is then installed on channel member 39 and second angle member 35', with bolts 65 and washers 71 being arranged in the appropriate configuration to provide the desired direction of opening offset pivotal movement for rack frame 23'.

Figure 7:
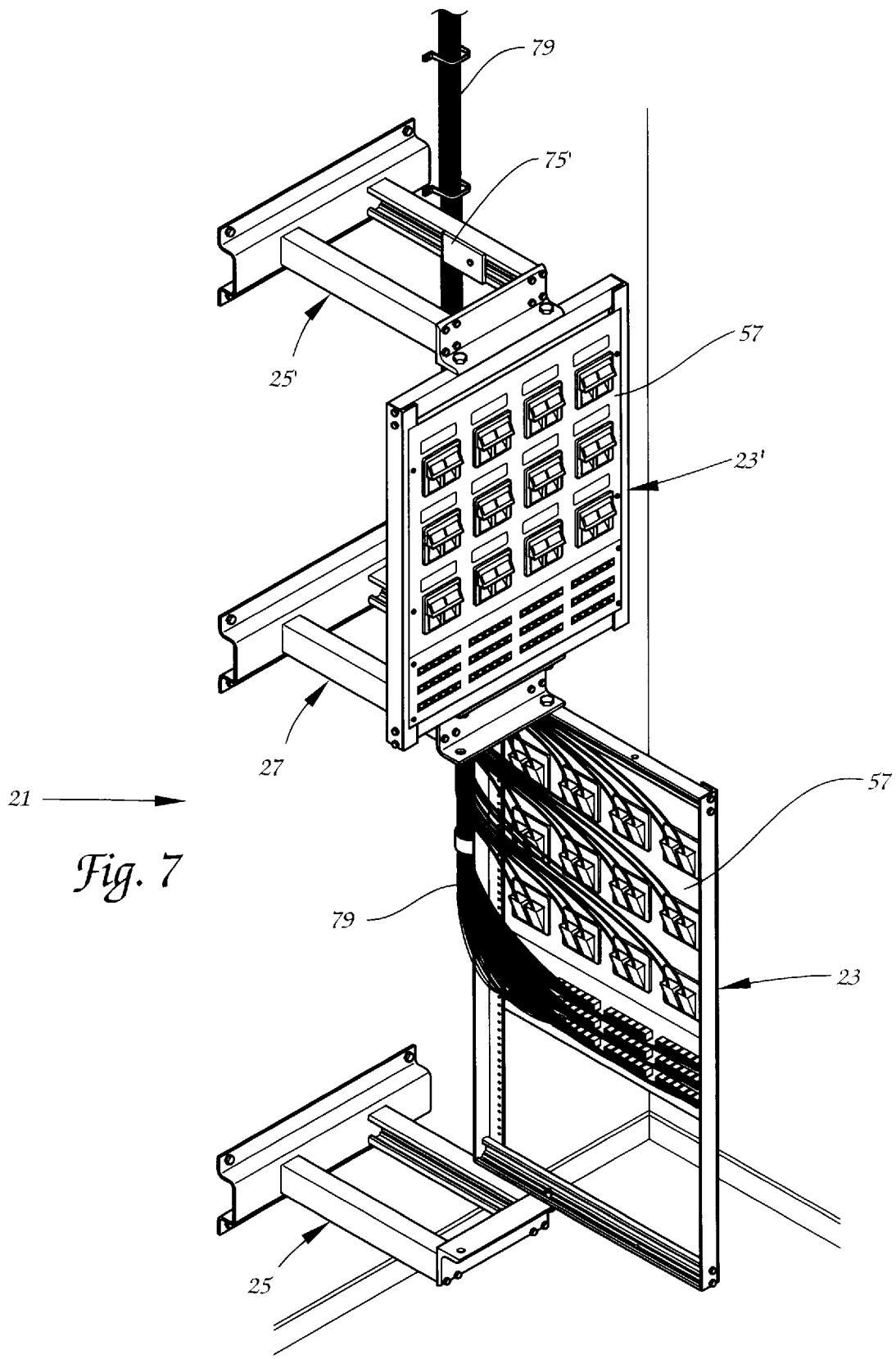
FIG. 7 is an isometric view of a swinging gate rack embodying the present invention, with the rack frames of the rack loaded with electronic components.

In FIG. 7, the swinging gate rack 21 of the present invention is depicted loaded with electronic components 57 on rack frames 23,23'. Electronic components 57 may be patch panels for interconnection of telecommunications or computer network equipment, such as is commonly found in offices and other commercial applications. The rack frame 23 is shown pivoted open in a counterclockwise direction to offer ready access to the backside of the electronic components 57 mounted in the rack frame. Placement of stop plate 75 in its downward position is advantageous in such situation in that the stop plate 75 prevents the rack frame 23 from opening to such an extent that installed wiring and cabling 79 would be damaged or pulled loose from their connections. Moreover, stop plate 75 also provides a point of resistance to allow punching or pressing on connectors from the back side of the rack frame 23 during connection of wiring and cabling 79 to electronic components installed in the rack frame.

The swinging gate rack 21 of the present invention is, in addition to having flexibility in its configuration, also easily installed at the appropriate location. Bracket assemblies 25,25',27 are installed on a wall with conventional fasteners such as screws 31, with the bracket assemblies being substantially vertically aligned and spaced apart predetermined distances depending on the size of the rack frames to be installed on the gate rack 21. Once the bracket assemblies are in place, rack frames such as frames 23,23' are then installed on angle member 35, channel member 39, and angle member 35' by engaging bolts 65 with washer 71 in the appropriate set of bores to establish a pivotal axis on the desired side of gate rack 21. Additional bolts 65 can then be engaged in the remaining sets of bores to serve as locking pins.

Mounting of electronic components 57 in rack frames 23,23', as shown in FIG. 7, is convenient and easily done. As noted, stop plates 75,75' can be engaged to provide a support to allow punching and pressing engagement of electronic components and cabling from the back side of rack frames 23,23'. When rack frames 23,23' are locked in the closed position, as shown in FIG. 4, installation work from the front of rack frames 23,23' can be easily undertaken.

Figure 8:
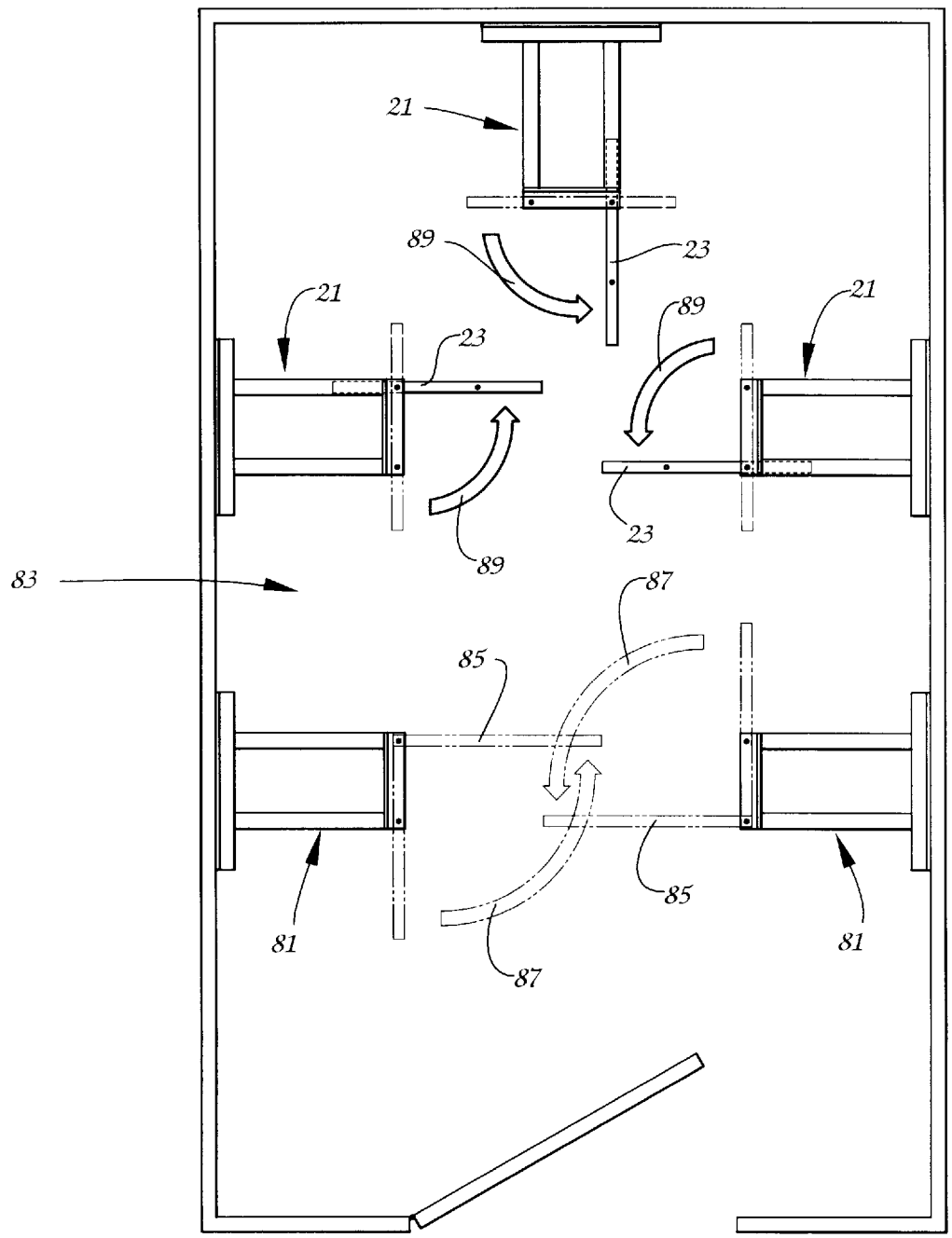
FIG. 8 is a diagrammatic plan view showing the space efficiency of the present invention as compared to conventional swinging gate racks.

The space-saving advantages of the swinging gate rack of the present invention are illustrated in FIG. 8, which depicts two conventional gate racks 81 and three swinging gate racks 21 of the present invention, all installed in an equipment room 83 of limited floor space. It is readily apparent that the opening clearance required for rack frames 85 of conventional racks 81, illustrated by arcs 87, is significantly greater than the opening clearance required by the offset rack frames 23 of the swinging gate racks 21 of the present invention, as shown by arcs 89, and this greater opening clearance would cause conventional rack frames 85 to collide when opened in the configuration shown. It should be noted that the widths of the rack frames 85 mounted on conventional racks 81 and rack frames 23 on swinging gate racks 21 are identical and that the significant reduction of clearance space for the present invention is entirely accounted for by the offset pivotal mounting of the rack frames 23 in swinging gate racks 21.

The present invention's provision for offset pivotal movement of rack frames 23,23' is attained by positioning each rack frame's pivotal axis on its rails at a location spaced from one end of the rail by an appropriate distance. Experimentation has disclosed that improved working efficiency and ease of use for the present invention are realized by locating the pivotal axis spaced from one rail end in the range of approximately 10% to 40% of rail length, with balance, proportions and required clearance space all having favorable characteristics in this range. Overall efficiency and convenience are optimized by positioning the pivotal axis within this range spaced approximately 30% of rail length from the rail end. Slight variations in location, however, will not deprive the present invention of its beneficial characteristics and advantages, and such slight variations would still be within the scope of the invention.

The swinging gate rack 21 of the present invention has several advantages over previous racks. It allows the opening pivotal direction of the rack frames to easily be modified without disassembling the gate rack itself, since the bolts 65 are easily interchangeable in the bores of the present invention, which may serve either as pivot bores or locking points, depending upon the desired configuration of the rack. The present invention also provides support for rack frames and the electronic components mounted therein at points offset from the horizontal ends of the rack frames, whereby a significant and highly cost-efficient saving of floor space can be obtained, as depicted in FIG. 8. This advantage makes it possible to mount the gate racks of the present invention in smaller spaces than was previously possible for conventional gate racks of the same size and also allows a greater number of gate racks of the present invention to be installed in areas of limited floor space. Moreover, the present invention's supporting of rack frames at offset locations also increases the load-bearing capacity of the gate racks in that the unsupported horizontal span, or cantilever, of the horizontal free ends of the rack frames is substantially reduced. This arrangement also reduces the moment arm of the load acting at the pivot points on which the rack frames are mounted and distributes the load on each horizontal side of the pivot points. The resulting greater loadbearing capacity makes it possible to use all aluminum structural components in the preferred embodiment of the present invention, further reducing the weight of the gate rack of the present invention and increasing the ease of installation of the gate rack. It will be understood the these structural components of the present invention can also be formed from other metals or substances having desirable properties.

The swinging gate rack of the present invention is also easily expandable from a one-tier rack to a two-tier rack having two rack frames. The channel member 39 which forms part of the second bracket assembly allows another rack frame to be readily added and mounted above it, while the third bracket assembly is easily mounted on the wall in the appropriate location to provide the angle member 35' to fully support the second rack frame 23'.

Mounting of electronic components in the rack frame 21 of the present invention is also convenient and easy in that rack frames 23,23' are held securely when locked in the closed position for mounting operations requiring access from the front of the rack frames, while the rack frames can be opened and engaged against stop plates 75,75' for installation work requiring access to the backsides of rack frames 23,23'.

It will therefore be readily understood by those persons skilled in the art that the present invention is susceptible of broad utility and application. Many embodiments and adaptations of the present invention other than those herein described, as well as many variations, modifications and equivalent arrangements will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

We claim:

1. A wall-mounted swinging gate rack for electronic components, comprising:

a rack frame for supporting electronic components thereon, said rack frame including two vertical uprights, a lower horizontal rail, and an upper horizontal rail, each of said rails having two ends and an extending length;

each of said rails having a first pivot point and a second pivot point, said pivot points being located intermediate said ends and spaced from each other, said first pivot points being substantially vertically aligned and said second pivot points being substantially vertically aligned to thereby define, respectively, first and second substantially vertical axes for pivot movement of said frame;

a first bracket assembly adapted to be fixedly attached to said wall, including a horizontal support for extending outwardly from said wall and a first pivot plate member mounted at the extending end of said horizontal support;

a second bracket assembly adapted to be fixedly attached to said wall and generally vertically aligned with and spaced a predetermined distance above said first bracket assembly, said second bracket assembly including a horizontal support for extending outwardly from said wall and a second pivot plate member mounted at the extending end of said horizontal support; and means for supporting said frame on said first and second pivot plate members at either said first or second pivot points for pivotal movement about said first or second vertical axis, respectively.

2. The gate rack of claim 1, wherein said first pivot point on each of said rails is located inset from one of said rail ends a distance between approximately 10% and 40% of said extending length of said rail, and said second pivot point is located inset from the other of said rail ends a distance between 10% and 40% of said extending length.

3. The gate rack of claim 2, wherein said first pivot point on each of said rails is located inset from said one rail end a distance of approximately 30% of said extending length, and said second pivot point is located inset from said other rail end a distance of approximately 30% of said extending length.

4. The gate rack of claim 1, wherein said first and second pivot points are, respectively, first and second bores, said first pivot plate member has a pair of bores aligned with and adjacent said bores on said lower rail, said second pivot plate member has a pair of bores aligned with and adjacent said bores on said upper rail, and said means for supporting said frame comprises a pair of pivot bolts disposed in said either of said first or second bores and said pivot plate member bores aligned and adjacent thereto.

5. The gate rack of claim 4, wherein said pivot bolts are selectively removable from the disposition in said bores.

6. The gate rack of claim 5, wherein said bores on said first and second pivot plate members are threaded and each of said pivot bolts has a threaded portion for threaded engagement in one of said pivot plate bores.

7. The gate rack of claim 6, wherein each of said pivot bolts includes a non-threaded portion disposed in one of said bores of said rails.

8. The gate rack of claim 1, wherein said rack frame is pivotally moveable to a closed position at which said rails are positioned generally parallel to said wall, and further comprising a stop for preventing pivotal movement of said rack frame beyond approximately 90° of pivotal displacement from the closed position.

9. The gate rack of claim 4, wherein said rack frame is pivotally moveable to a closed position wherein said rails are positioned generally parallel for disposition to said wall, and further comprising a pair of locking bolts for disposition in the other of said first or second bores and said pivot plate member bores aligned and adjacent thereto for locking said frame in the closed position.

10. The gate rack of claim 9, wherein said locking bores are selectively releasable from the disposition in said bores.

11. The gate rack of claim 10, wherein said bores on said pivot plate members are threaded, and each said locking bolts has a threaded portion for engagement in one of said pivot plate member bores.

12. The gate rack of claim 11, wherein each of said locking bolts includes a non-threaded portion for disposition in one of said bores of said rails.

13. The gate rack of claim 1, wherein said first pivot plate member comprises an angle member having a horizontal flange and said second pivot plate member comprises a channel member having two horizontal channel flanges and a web portion intermediate said channel flanges.

14. The gate rack of claim 1, further comprising:

a second rack frame for supporting electronic components thereon, said second rack frame including two vertical uprights, an upper horizontal rail, and a lower horizontal rail, each of said rails having two ends and an extending length;

each of said second rack frame rails having a first pivot point and a second pivot point, said pivot points being located intermediate said ends and spaced from each other, said first pivot points being substantially vertically aligned and said second pivot points being substantially vertically aligned to thereby define, respectively, first and second substantially vertical axes of said second frame for pivotal movement of said second frame;

a third bracket assembly adapted to be fixedly attached to said wall and generally vertically aligned with and spaced a predetermined distance above said second bracket assembly, including a horizontal support for extending outwardly from said wall and a third pivot plate member mounted at the extending end of said horizontal support; and means for supporting said second rack frame on said second and third pivot plate members at either said first or second pivot points of said second frame for pivotal movement about said first or second vertical axis of said second frame, respectively.

15. The gate rack of claim 14, wherein said first pivot plate member comprises an angle member having a horizontal flange, said second pivot plate member comprises a channel member having two horizontal channel flanges and a web portion intermediate said channel flanges, and said third pivot plate member comprises an angle member having a horizontal flange.

16. A wall-mounted swinging gate rack for electronic components, comprising:

a first rack frame for supporting electronic components thereon, said first rack frame including two vertical uprights, an upper horizontal rail, and a lower horizontal rail, each of said rails having two ends and an extending length;

a second rack frame for supporting electronic components thereon, said second rack frame including two vertical uprights, an upper horizontal rail, and a lower horizontal rail, each of said rails having two ends and an extending length;

each of said rails having an inset pivot point located spaced from one of said ends of said rail a distance between approximately 10% and 40% of said extending length, said pivot points being substantially vertically aligned to define a substantially vertical axis for inset pivotal movement of said rack frames;

a first bracket assembly adapted to be fixedly attached to said wall, including a horizontal support for extending outwardly from said wall and a first pivot plate member mounted at the extending end of said horizontal support;

a second bracket assembly adapted to be fixedly attached to said wall and generally vertically aligned with and spaced a predetermined distance above said first bracket assembly, said second bracket assembly including a horizontal support for extending outwardly from said wall and a second pivot plate member mounted at the extending end of said horizontal support;

a third bracket assembly adapted to be fixedly attached to said wall and generally vertically aligned with and spaced a predetermined distance above said second bracket assembly, including a horizontal support for extending outwardly from said wall and a third pivot plate member mounted at the extending end of said horizontal support;

means for supporting said first frame on said first and second pivot plate members at said pivot points of said first frame for inset pivotal movement about said vertical axis; and means for supporting said second frame on said second and third pivot plate members at said pivot points of said second frame for inset pivotal movement about said vertical axis.

17. The gate rack of claim 16, wherein said first and second rack frames are each pivotally moveable to a closed position wherein said rails are positioned generally parallel to the wall, and further comprising means for selectively locking each of said frames in the closed position to prevent pivotal movement thereof.

18. A wall-mounted swinging gate rack for electronic components, comprising:

a first rack frame for supporting electronic components thereon, said first rack frame including two vertical uprights, an upper horizontal rail, and a lower horizontal rail, each of said rails having two ends and an extending length;

a second rack frame for supporting electronic components thereon, said second rack frame including two vertical uprights, an upper horizontal rail, and a lower horizontal rail, each of said rails having two ends and an extending length;

said rails each having first and second bores formed therein, each of said first bores being inset from one of said rail ends a distance between approximately 10% and 40% of said extending length, and each of said second bores being inset from the other of said rail ends a distance between approximately 10% and 40% of said extending length, said first bores being substantially vertically aligned to define a first substantially vertical axis, said second bores being substantially vertically aligned to define a second substantially vertical axis;

a lower bracket assembly adapted to be fixedly attached to said wall, including a horizontal support for extending outwardly from said wall and a lower pivot plate member mounted at the extending end of said horizontal support;

an intermediate bracket assembly adapted to be fixedly attached to said wall and generally vertically aligned with and spaced a predetermined distance above said lower bracket assembly, said intermediate bracket assembly including a horizontal support for extending outwardly from said wall and an intermediate pivot plate member mounted at the extending end of said horizontal support;

an upper bracket assembly adapted to be fixedly attached to said wall and generally vertically aligned with and spaced a predetermined distance above said intermediate bracket assembly, including a horizontal support for extending outwardly from said wall and an upper pivot plate member mounted at the extending end of said horizontal support;

means for supporting said first rack frame on said lower and intermediate pivot plate members at either said first or second bores for inset pivotal movement about either said first or second substantially vertical axis, respectively;

means for supporting said second rack frame on said intermediate and upper pivot plate members at either said first or second bores for inset pivotal movement about either said first or second substantially vertical axis, respectively;

said first frame and said second frame each being pivotally moveable to a closed position wherein said respective frame rails are positioned generally parallel to said wall; and means for selectively locking each of said frames in the closed position to prevent pivotal movement thereof.

* * * * *

UNITED STATES PATENT AND TRADEMARK OFFICE
CERTIFICATE OF CORRECTION

PATENT NO. : 5,806,687
DATED : September 15, 1998
INVENTOR(S) : Ballesteros et al.

It is certified that error appears in the above-identified patent and that said Letters Patent is hereby corrected as shown below:

Col. 4, line 28, delete "accompany" and insert therefor --accompanying--.

Col. 8, line 14, delete "the" after "understood" and insert therefor --that--.

Col. 9, line 20, delete "inset" and insert therefor --offset--.

Col. 9, line 25, delete "inset" and insert therefor --offset--.

Signed and Sealed this

Eighth Day of August, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO. : 5,806,687
DATED : September 15, 1998
INVENTOR(S) : Ballesteros, et. al.

It is certified that error appears in the above-identified patent and that said Letters Patent is hereby corrected as shown below:

Title page, item [73], Assignee: add-- Chatsworth Products, Inc.--.

Signed and Sealed this

Twenty-fourth Day of October, 2000

Attest:

Q. TODD DICKINSON

Attesting Officer

Director of Patents and Trademarks